United States Patent
Li

(10) Patent No.: US 8,955,816 B2
(45) Date of Patent: Feb. 17, 2015

(54) FAN MOUNTING APPARATUS

(71) Applicants: Hong Fu Jin Precision Industry (ShenZhen) Co., Ltd., Shenzhen (CN); Hon Hai Precision Industry Co., Ltd., New Taipei (TW)

(72) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/137,353

(22) Filed: Dec. 20, 2013

(65) Prior Publication Data
US 2015/0001370 A1    Jan. 1, 2015

(30) Foreign Application Priority Data

Jun. 28, 2013    (CN) .................... 2013 1 02653474

(51) Int. Cl.
| | |
|---|---|
| F16M 13/00 | (2006.01) |
| F16M 1/00 | (2006.01) |
| F16M 3/00 | (2006.01) |
| F16M 5/00 | (2006.01) |
| F16M 7/00 | (2006.01) |
| F16M 9/00 | (2006.01) |
| F16M 11/00 | (2006.01) |
| F16M 13/02 | (2006.01) |

(52) U.S. Cl.
CPC ..................................... *F16M 13/02* (2013.01)
USPC ....... 248/674; 248/675; 361/679.46; 361/697

(58) Field of Classification Search
USPC .................. 248/674, 675, 27.1, 27.3, 346.01, 248/346.03, 349.1, 346.04, 678, 188.1, 519, 248/523, 526; 361/679.46, 695, 697; 454/184
See application file for complete search history.

(56) References Cited

U.S. PATENT DOCUMENTS

| | | | |
|---|---|---|---|
| 6,449,152 B1 * | 9/2002 | Lin ............................... | 361/697 |
| 6,507,491 B1 * | 1/2003 | Chen ............................ | 361/697 |
| 6,625,021 B1 * | 9/2003 | Lofland et al. ................ | 361/697 |
| 6,865,074 B2 * | 3/2005 | Lehtonen et al. ......... | 361/679.46 |
| 7,236,369 B2 * | 6/2007 | Barina et al. .................. | 361/719 |
| 7,382,616 B2 * | 6/2008 | Stefanoski .................... | 361/698 |
| 7,385,826 B2 * | 6/2008 | Barina et al. .................. | 361/719 |
| 8,740,560 B2 * | 6/2014 | Gong et al. ................. | 415/214.1 |

* cited by examiner

*Primary Examiner* — Nkeisha Smith
(74) *Attorney, Agent, or Firm* — Novak Druce Connolly Bove + Quigg LLP

(57) ABSTRACT

A fan mounting apparatus includes an operating platform, a mounting base, multiple mounting members, multiple pushing members, and multiple driving members. The mounting base is located on the operating platform and configured to mount a fan frame. The multiple mounting members are rotatably connected to the mounting base and configured to mount the multiple fan brackets. The multiple pushing members are configured to push the multiple mounting members. The multiple driving members are configured to push the multiple pushing members. In an original state, the multiple mounting members are substantially parallel to the mounting base. When the multiple pushing members are pushed out of the operating platform by the multiple driving members, the multiple mounting members rotate relative to the mounting base and resist against the fan frame, and the multiple fan brackets on the multiple mounting members are mounted to the fan frame.

20 Claims, 9 Drawing Sheets

FAN MOUNTING APPARATUS

BACKGROUND

1. Technical Field

The present disclosure relates to a fan mounting apparatus.

2. Description of Related Art

Fans are widely used to dissipate heat from computer systems. The fans may be mounted to a rack, and the rack is then mounted to a plate of the computer system. The rack is mounted to the plate by screws, which mounting process may be laborious and time consuming.

Therefore, there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
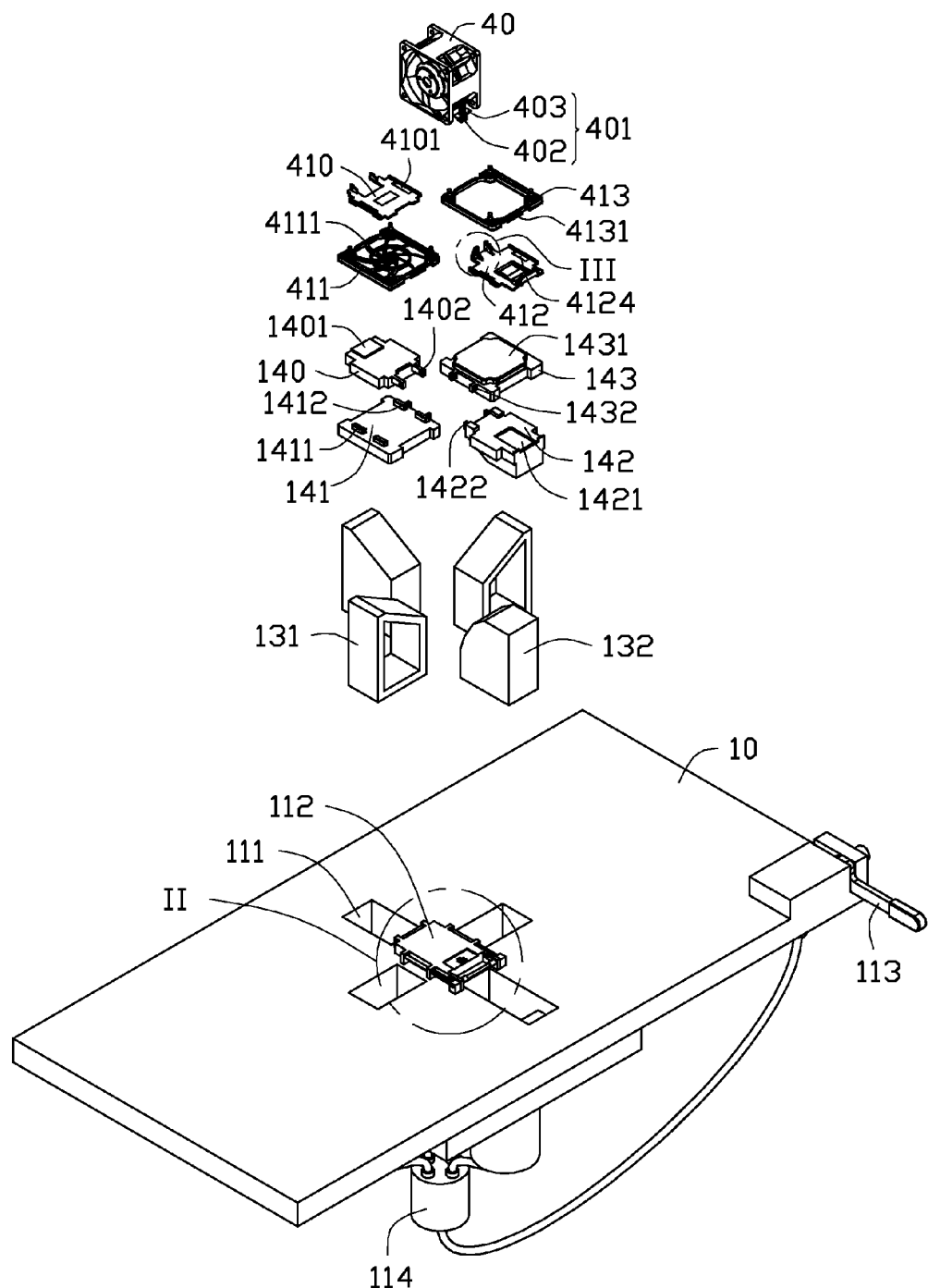
FIG. 1 is an isometric, exploded view of an embodiment of a fan mounting apparatus, together with a fan frame and multiple fan brackets.
Figure 2:
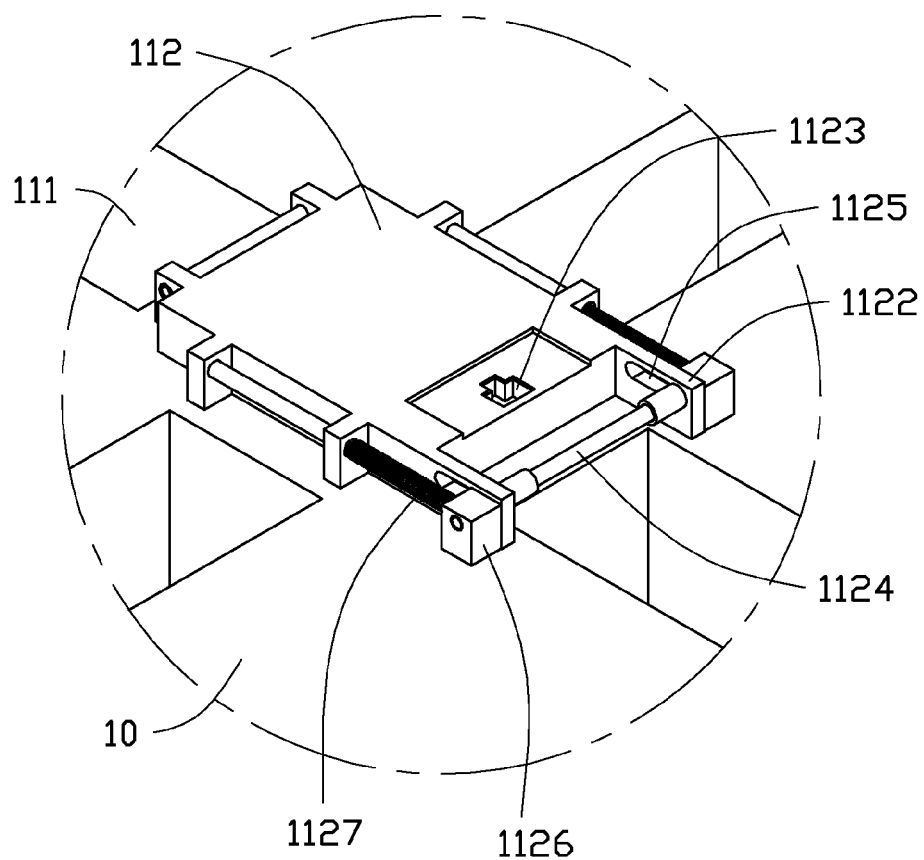
FIG. 2 is an enlarged view of a circled portion II of FIG. 1.
Figure 3:
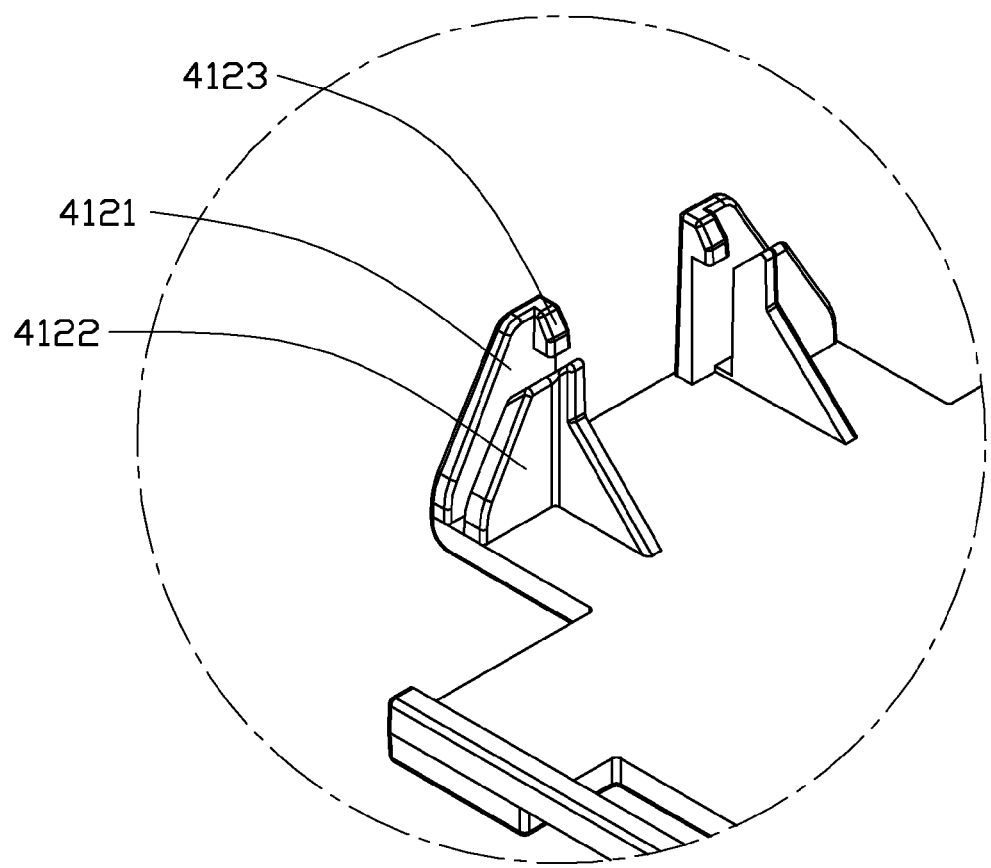
FIG. 3 is an enlarged view of a circled portion III of FIG. 1.
Figure 4:
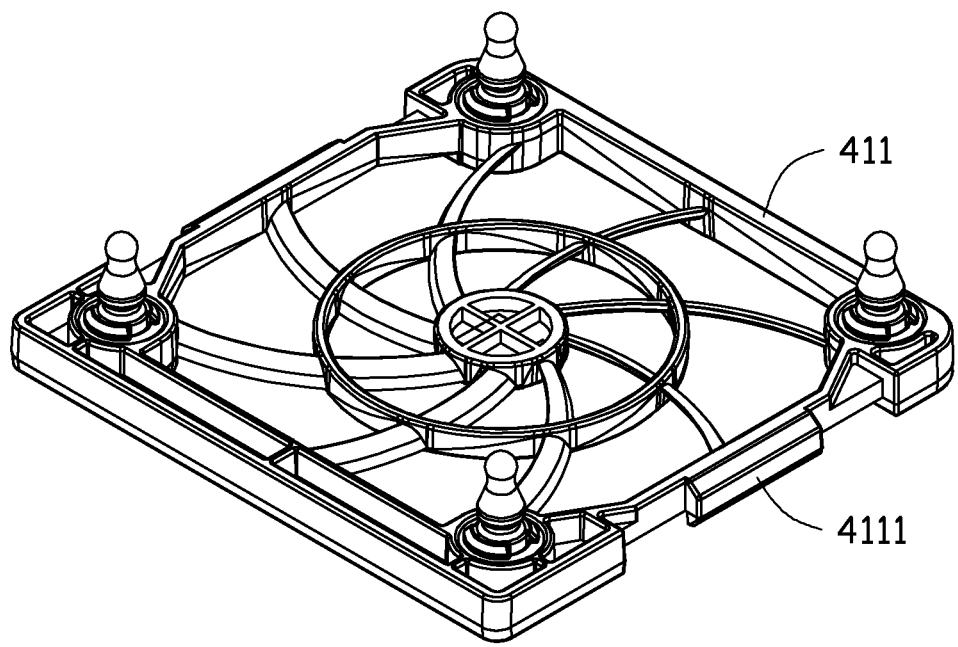
FIG. 4 is an isometric view of a second fan bracket of FIG. 1.
Figure 5:
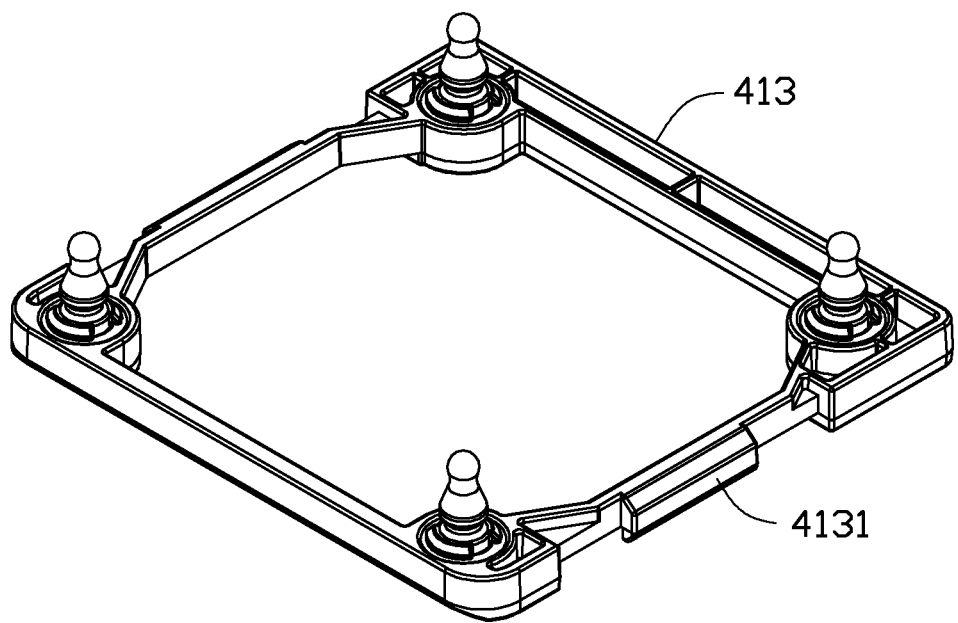
FIG. 5 is an isometric view of a fourth fan bracket of FIG. 1.

FIGS. 1 through 5 show an embodiment of a fan mounting apparatus assembly includes a first fan bracket 410, a second fan bracket 411, a third fan bracket 412, and a fourth fan bracket 413 mounted to a fan frame 40.

The mounting apparatus includes an operating platform 10. A mounting base 112 is located on the operating platform 10 for mounting the fan frame 40. The mounting base 112 has a shape corresponding to a shape of a bottom surface of the fan frame 40. A locating slot 1123 is defined in the mounting base 112 to mount the fan frame 40. In one embodiment, each of a pair of connecting portions 1122 extends from each side of four sides of the mounting base 112. A mounting axle 1124 is connected between each of the pair of connecting portions 1122. A sliding slot 1125 is defined in each of the connecting portions 1122 of one pair of the connecting portions 1122. Two sliding blocks 1126 are located adjacent to two ends of one of the mounting axles 1124, respectively, and each of the two sliding blocks 1126 corresponds to one sliding slot 1125. An elastic member 1127 is located between each sliding block 1126 and a corresponding connecting portion 1122 adjacent to the sliding block 1126. In one embodiment, the elastic member 1127 is a compression spring.

The mounting apparatus further includes a first mounting member 140, a second mounting member 141, a third mounting member 142, and a fourth mounting member 143 for mounting the first fan bracket 410, the second fan bracket 411, the third fan bracket 412, and the fourth fan bracket 413, respectively. A first locating portion 1401 is formed on the first mounting member 140 to mount the first fan bracket 410. A pair of first mounting portions 1402 protrudes from the first mounting member 140. A second locating portion 1411 is formed on the second mounting member 141 to mount the second fan bracket 411. A pair of second mounting portions 1412 protrudes from the second mounting member 141.

A third locating portion 1421 is formed on the third mounting member 142 to mount the third fan bracket 412. A pair of third mounting portions 1422 protrudes from the third mounting member 142. A fourth locating portion 1431 is formed on the fourth mounting member 143 to mount the fourth fan bracket 413. A pair of fourth mounting portions 1432 protrudes from the fourth mounting member 143. Each pair of the first mounting portions 1402, the second mounting portions 1412, the third mounting portions 1422, and the fourth mounting portions 1432 is rotatably connected to one corresponding mounting axle 1124. Thus, the first mounting member 140, the second mounting member 141, the third mounting member 142, and the fourth mounting member 143 are rotatably connected to the corresponding four sides of the mounting base 112.

In one embodiment, each of the first mounting member 140, the second mounting member 141, the third mounting member 142, and the fourth mounting member 143 has a shape corresponding to that of the first fan bracket 410, the second fan bracket 411, the third fan bracket 412, and the fourth fan bracket 413, respectively. A bottom side of the third mounting member 142 forms an inclined surface.

The mounting apparatus further includes two first pushing members 131 and two second pushing members 132 to push the first mounting member 140, the second mounting member 141, the third mounting member 142, and the fourth mounting member 143 to rotate relative to the mounting base 112. Four through holes 111 are defined in the operating platform 10 to receive the corresponding two first pushing members 131 and the corresponding two second pushing members 132. In one embodiment, a weight of each of the two first pushing members 131 is less than a weight of each of the two second pushing members 132. A side surface of each of the two first pushing members 131 and the two second pushing members 132 is an inclined surface.

The mounting apparatus further includes four driving members 114 located at a bottom side of the operating platform 10. A switch 113 is located on the operating platform 10 to control the four driving members 114. The switch 113 is operated to power on or power off the four driving members 114. The four driving members 114 are configured to push the corresponding two first pushing members 131 and the corresponding two second pushing members 132 out of the four through holes 111. Each of the four driving members 114 exerts a substantially uniform pushing force on each of the two first pushing members 131 and each of the two second pushing members 132. In one embodiment, a moving speed of each of the two first pushing members 131 is greater than a moving speed of each of the two second pushing members 132, and the four driving members 114 are substantially cylindrical.

A connector 401 is located on the fan frame 40. The connector 401 includes a root portion 402 and a locking portion 403. The locking portion 403 is connected substantially perpendicularly to a top portion of the root portion 402. The root portion 402 is received through the locating slot 1123 of the mounting base 112. Two first locking brackets 4121 and two second locking brackets 4122 are located on the third fan bracket 412. A locking block 4123 extends substantially perpendicularly from each of the two first locking brackets 4121 toward one corresponding second locking bracket 4122. Two first mounting slots 4101 are defined adjacent to two sides of the first fan bracket 410, respectively. Two second mounting slots 4124 are defined adjacent to two sides of the third fan bracket 412, respectively. Two first mounting blocks 4111 protrude from adjacent sides of the second fan bracket 411, respectively. Two second mounting blocks 4131 protrude adjacent to two sides of the fourth fan bracket 413, respectively.

In one embodiment, the two first locking brackets 4121 are substantially parallel to the two second locking brackets 4122. A distance between each of the two first locking brackets 4121 and the respective second locking bracket 4122 is substantially equal to a thickness of the locking block 4123. Dimensions of each of the two first mounting blocks 4111 and the two second mounting blocks 4131 is substantially equal to dimensions of each of the two first mounting slots 4101 and the two second mounting slots 4124.

Figure 6:
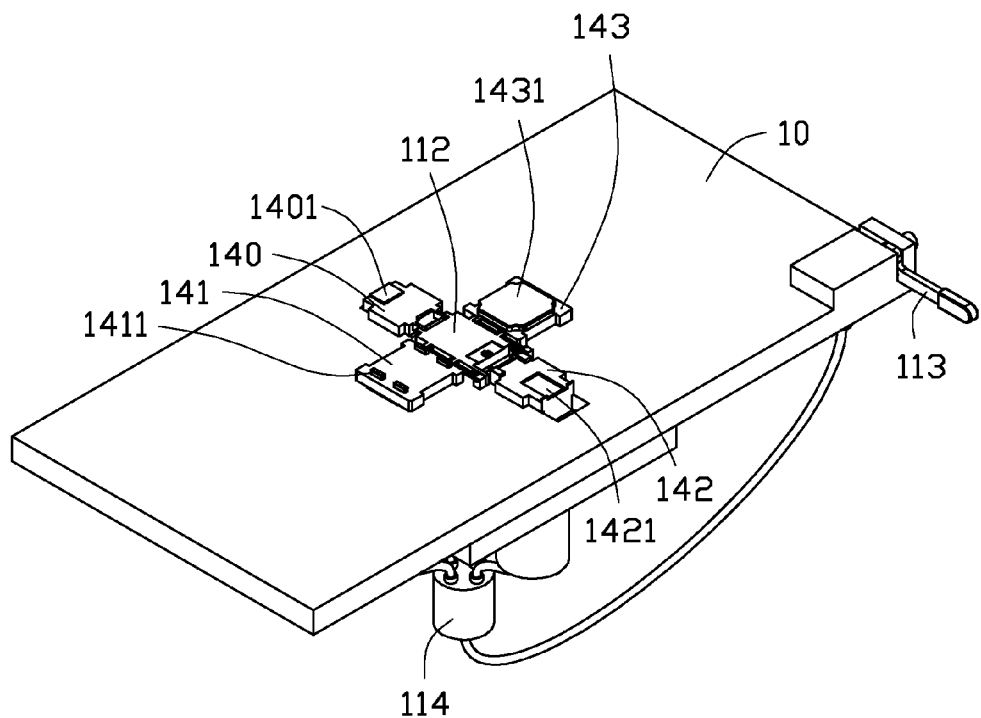
FIG. 6 is an assembled view of the fan mounting apparatus of FIG. 1.
Figure 7:
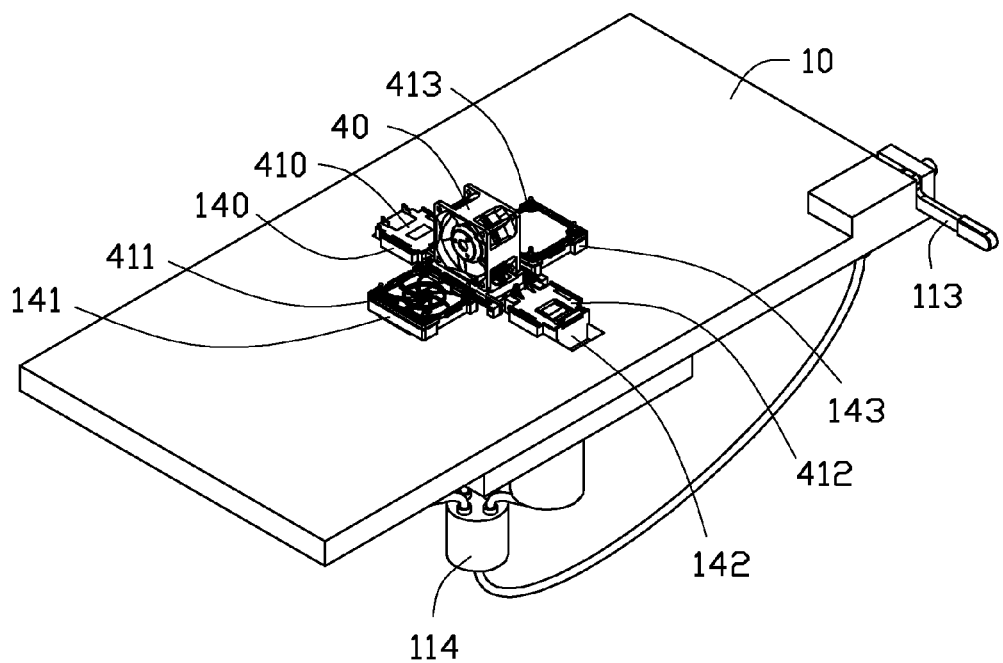
FIG. 7 is an isometric view of the fan mounting apparatus of FIG. 6, together with the fan frame and the multiple fan brackets in an original state.
Figure 8:
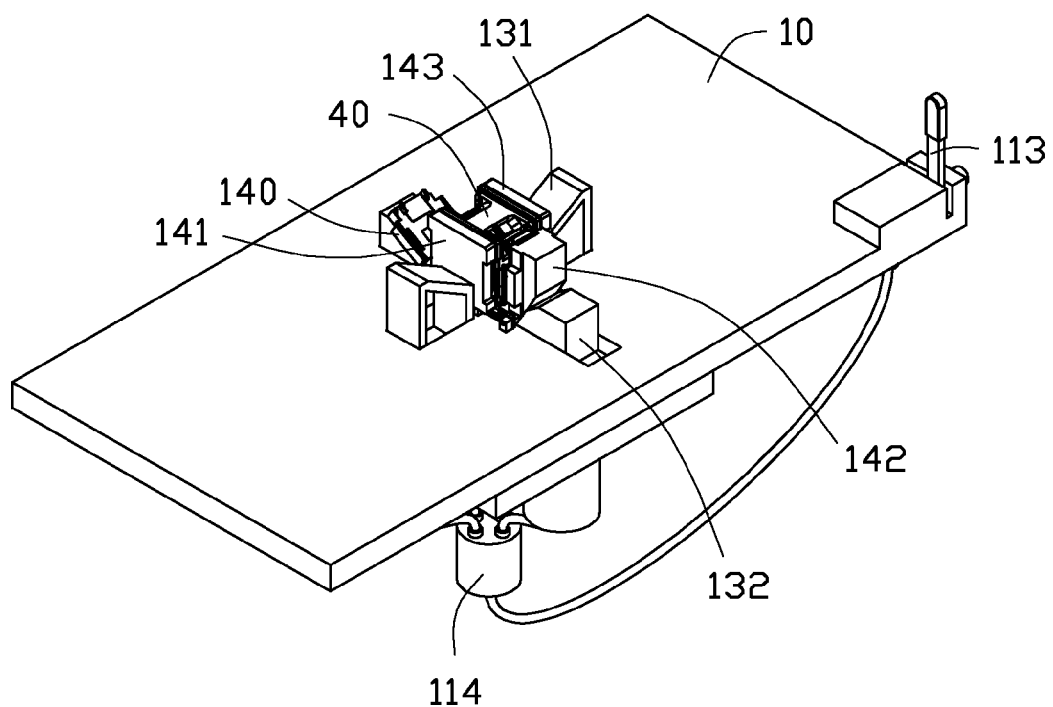
FIG. 8 is an isometric view of the fan mounting apparatus of FIG. 7 in a first working state.
Figure 9:
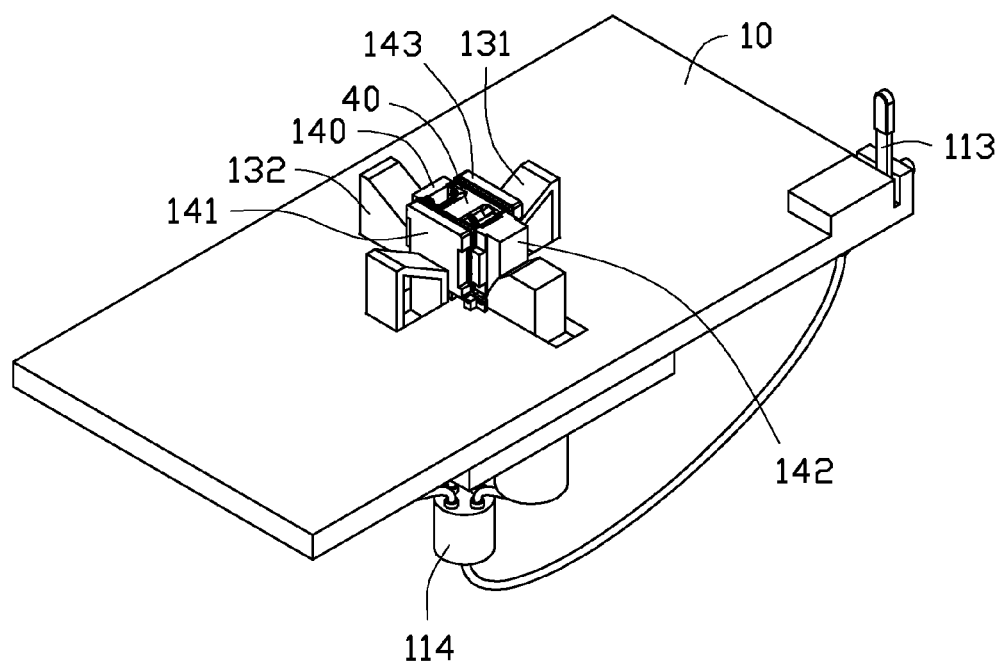
FIG. 9 is an isometric view of the fan mounting apparatus of FIG. 7 in a second working state.

FIGS. 6 to 9 show that in assembly, each of the first mounting member 140, the second mounting member 141, the third mounting member 142, and the fourth mounting member 143 is positioned on a corresponding side of the mounting base 112. Each pair of the first mounting portions 1402, the second mounting portions 1412, the third mounting portions 1422, and the fourth mounting portions 1432 aligns with a corresponding pair of connecting portions 1122. The mounting axle 1124 of each connecting portion 1122 is received through the corresponding pair of connecting portions 1122 and the corresponding pair of first mounting portions 1402, the second mounting portions 1412, the third mounting portions 1422, and the fourth mounting portions 1432.

The first mounting member 140 and the third mounting member 142 are rotatably mounted to two shorter sides of the mounting base 112, respectively. The second mounting member 141 and the fourth mounting member 143 are rotatably mounted to two longer sides of the mounting base 112, respectively. The two first pushing members 131 are received in two opposite through holes 111 below the second mounting member 141 and the fourth mounting member 143, respectively. The two second pushing members 132 are received in two opposite through holes 111 below the first mounting member 140 and the third mounting member 142, respectively. A bottom surface of each of the two first pushing members 131 and the two second pushing members 132 abuts a corresponding driving member 114.

In use, when the switch 113 is off, the two first pushing members 131 and the two second pushing members 132 are received in the four through holes 111 in an original state. The first mounting member 140, the second mounting member 141, the third mounting member 142, and the fourth mounting member 143 closely contact the operating platform 10 and cover the four through holes 111. The first mounting member 140, the second mounting member 141, the third mounting member 142, and the fourth mounting member 143 are substantially parallel to the mounting base 112. The fan frame 40 is placed on the mounting base 112. The connector 401 of the fan frame 40 is received in the locating slot 1123 of the mounting base 112, thereby mounting the fan frame 40 onto the mounting base 112.

The first fan bracket 410 is placed onto the first mounting member 140 by the first locating portion 1401. The second fan bracket 411 is placed onto the second mounting member 141 by the second locating portion 1411. The third fan bracket 412 is placed onto the third mounting member 142 by the third locating portion 1421. The fourth fan bracket 413 is placed onto the fourth mounting member 143 by the fourth locating portion 1431.

When the switch 113 is turned on, the four driving members 114 are powered on and push the two first pushing members 131 and the two second pushing members 132 out of the four through holes 111. The two first pushing members 131 and the two second pushing members 132 push the first mounting member 140, the second mounting member 141, the third mounting member 142, and the fourth mounting member 143 to rotate. When the first mounting member 140, the second mounting member 141, the third mounting member 142, and the fourth mounting member 143 are rotated to be substantially perpendicular to the mounting base 112 and resist against the fan frame 40, the first fan bracket 410, the second fan bracket 411, the third fan bracket 412, and the fourth fan bracket 413 are mounted to the fan frame 40.

When the inclined side surface of one of the two second pushing members 132 resists against the inclined bottom surface of the third mounting member 142, the third mounting member 142 is pushed toward the mounting base 112. Thus, the corresponding mounting axle 1124 moves the two sliding blocks 1126 along the sliding slots 1125, and the two sliding blocks 1126 elastically deform the elastic members 1127.

When the locking portion 403 of the connector 401 slides between the two first locking brackets 4121 and the two second locking brackets 4122, a bottom surface of the locking portion 403 resists against the locking blocks 4123 of the two first locking brackets 4121, and the two first locking brackets 4121 elastically deform. When the bottom surface of the locking portion 403 passes through the locking blocks 4123, the two first locking brackets 4121 elastically restore, and the locking portion 403 is fixed between the two first locking brackets 4121 and the two second locking brackets 4122.

In the above process, the second mounting member 141 and the fourth mounting member 143 are rotated before the first mounting member 140 and the third mounting member 142 are rotated, and the second fan bracket 411 and the fourth fan bracket 413 are mounted to the fan frame 40 before the first fan bracket 410 and the third fan bracket 412 are mounted. The two first mounting blocks 4111 and the two second mounting blocks 4131 are received in the two first mounting slots 4101 and the two second mounting slots 4124, respectively. Thus, the first fan bracket 410, the second fan bracket 411, the third fan bracket 412, and the fourth fan bracket 413 are mounted to the fan frame 40.

When the first fan bracket 410, the second fan bracket 411, the third fan bracket 412, and the fourth fan bracket 413 are mounted to the fan frame 40, the switch 113 is switched off. The four driving members 114 are powered off and release the two first pushing members 131 and the two second pushing members 132. The two first pushing members 131 and the two second pushing members 132 return to the original state. The first mounting member 140, the second mounting member 141, the third mounting member 142, and the fourth mounting member 143 rotate back to be substantially parallel to the mounting base 112. The two sliding blocks 1126 release the elastic members 1127, the elastic members 1127 elastically restore, and the assembled fan frame 40 can be detached from the mounting base 112.

Even though numerous characteristics and advantages of the present disclosure have been set forth in the foregoing description, together with details of the structure and function of the disclosure, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A fan mounting apparatus comprising:
    an operating platform;
    a mounting base located on the operating platform; the mounting base is configured to accommodate a fan frame;
    multiple mounting members rotatably connected to the mounting base; the multiple mounting members are configured to accommodate multiple fan brackets;
    multiple pushing members configured to push the multiple mounting members; and
    multiple driving members configured to push the multiple pushing members, wherein the multiple pushing members are received in the operating platform below the multiple mounting members at an original state, the multiple mounting members are substantially parallel to the mounting base; when the multiple pushing members are pushed out of the operating platform by the multiple driving members, the multiple mounting members rotate to substantially perpendicular to the mounting base and resist against the fan frame, and the multiple fan brackets on the multiple mounting members are mounted to the fan frame.

2. The fan mounting apparatus of claim 1, wherein the multiple pushing members comprises two first pushing members and two second pushing members; a weight of each of the two first pushing members is less than a weight of each of the two second pushing members; and each of the multiple driving members exerts a substantially uniform pushing force on each of the two first pushing members and each of the two second pushing members.

3. The fan mounting apparatus of claim 2, wherein a bottom surface of one of the multiple mounting members is an inclined surface; and a side surface of each of the two first pushing members and the two second pushing members is an inclined surface.

4. The fan mounting apparatus of claim 2, wherein two mounting blocks protrude from adjacent sides of one pair of the fan brackets which are opposite to each other; two mounting slots are defined adjacent to two sides of another pair of fan brackets which are opposite to each other; the pair of fan brackets with the mounting blocks are located on the mounting members above the two first pushing members; and the pair of fan brackets with the mounting slots are located on the mounting members above the two second pushing members.

5. The fan mounting apparatus of claim 4, wherein a dimension of each of the two mounting blocks is substantially equal to a dimension of each of the two mounting slots.

6. The fan mounting apparatus of claim 1, wherein each of a pair of connecting portions extends from each side of four sides of the mounting base; a mounting axle is mounted to the connecting portions of each of the pair of connecting portions; each of a pair of mounting portions protrudes from each of the multiple mounting members; each of the pair of mounting portions is rotatably connected to each of the mounting axles; and each of the multiple mounting members is rotatably connected to the mounting base.

7. The fan mounting apparatus of claim 6, wherein a sliding slot is defined in each of the connecting portions of one pair of the connecting portions; two sliding blocks are located adjacent to two ends of one of the mounting axles which correspond to the sliding slots; and an elastic member is positioned between each of the two sliding blocks and a connecting portion adjacent to the sliding block.

8. The fan mounting apparatus of claim 1, wherein a locating slot is defined in the mounting base to locate the fan frame; a connector is located on the fan frame; the connector comprises a root portion and a locking portion; the locking portion is connected substantially perpendicularly to a top portion of the root portion; and the root portion is received through the locating slot of the mounting base.

9. The fan mounting apparatus of claim 8, wherein two first locking brackets and two second locking brackets are located on one of the multiple fan brackets; a locking block extends substantially perpendicularly from each of the two first locking brackets toward one corresponding second locking bracket; a bottom of the locking portion passes through the locking block on each of the two first locking brackets; and the locking portion is fixed between the two first locking brackets and the two second locking brackets.

10. The fan mounting apparatus of claim 9, wherein the two first locking brackets are substantially parallel to the two second locking brackets; and a distance between each of the two first locking brackets and the respective second locking bracket is substantially equal to a thickness of the locking block.

11. A fan mounting apparatus comprising:
    an operating platform;
    a mounting base located on the operating platform; the mounting base is configured to accommodate a fan frame;
    multiple mounting members rotatably connected to the mounting base; the multiple mounting members are configured to accommodate multiple fan brackets;
    multiple pushing members configured to push the multiple mounting members; and
    multiple driving members configured to push the multiple pushing members, wherein the multiple pushing members are received in the operating platform below the multiple mounting members at an original state, the multiple mounting members are substantially parallel to the mounting base; when the multiple pushing members are pushed out of the operating platform by the multiple driving members, the multiple mounting members rotate to substantially perpendicular to the mounting base and resist against the fan frame, one of the multiple pushing members pushes a respective mounting member of the multiple mounting members substantially horizontally move toward the mounting base; and the multiple fan brackets on the multiple mounting members are mounted to the fan frame.

12. The fan mounting apparatus of claim 11, wherein the multiple pushing members comprises two first pushing members and two second pushing members; a weight of each of the two first pushing members is less than a weight of each of the two second pushing members; and each of the multiple driving members exerts a substantially uniform pushing force on each of the two first pushing members and each of the two second pushing members.

13. The fan mounting apparatus of claim 12, wherein a bottom surface of one of the multiple mounting members is an inclined surface; and a side surface of each of the two first pushing members and the two second pushing members is an inclined surface.

14. The fan mounting apparatus of claim 12, wherein two mounting blocks protrude from adjacent sides of one pair of the fan brackets which are opposite to each other; two mounting slots are defined adjacent to two sides of another pair of fan brackets which are opposite to each other; the pair of fan brackets with the mounting blocks are located on the mounting members above the two first pushing members; and the pair of fan brackets with the mounting slots are located on the mounting members above the two second pushing members.

15. The fan mounting apparatus of claim 14, wherein a dimension of each of the two mounting blocks is substantially equal to a dimension of each of the two mounting slots.

16. The fan mounting apparatus of claim 11, wherein each of a pair of connecting portions extends from each side of four sides of the mounting base; a mounting axle is mounted to the connecting portions of each of the pair of connecting portions; each of a pair of mounting portions protrudes from each of the multiple mounting members; each of the pair of mounting portions is rotatably connected to each of the mounting axles; and each of the multiple mounting members is rotatably connected to the mounting base.

17. The fan mounting apparatus of claim 16, wherein a sliding slot is defined in each of the connecting portions of one pair of the connecting portions; two sliding blocks are located adjacent to two ends of one of the mounting axles which correspond to the sliding slots; and an elastic member is positioned between each of the two sliding blocks and a connecting portion adjacent to the sliding block.

18. The fan mounting apparatus of claim 11, wherein a locating slot is defined in the mounting base to locate the fan frame; a connector is located on the fan frame; the connector comprises a root portion and a locking portion; the locking portion is connected substantially perpendicularly to a top portion of the root portion; and the root portion is received through the locating slot of the mounting base.

19. The fan mounting apparatus of claim 18, wherein two first locking brackets and two second locking brackets are located on one of the multiple fan brackets; a locking block extends substantially perpendicularly from each of the two first locking brackets toward one corresponding second locking bracket; a bottom of the locking portion passes through the locking block on each of the two first locking brackets; and the locking portion is fixed between the two first locking brackets and the two second locking brackets.

20. The fan mounting apparatus of claim 19, wherein the two first locking brackets are substantially parallel to the two second locking brackets; and a distance between each of the two first locking brackets and the respective second locking bracket is substantially equal to a thickness of the locking block.

* * * * *